United States Patent [19]

Tsukaguchi et al.

[11] Patent Number: 4,731,703

[45] Date of Patent: Mar. 15, 1988

[54] POWER SUPPLY STRUCTURE AND SYSTEM FOR MOUNTING THE SAME

[75] Inventors: Tamotsu Tsukaguchi, Hiratsuka; Hiroshi Kozai; Toshio Mori, both of Hadano; Fumiyuki Kobayashi, Sagamihara, all of Japan

[73] Assignee: Hitachi Ltd., Tokyo, Japan

[21] Appl. No.: 920,607

[22] Filed: Oct. 20, 1986

[30] Foreign Application Priority Data

Oct. 18, 1985 [JP] Japan .................. 60-231140
Oct. 23, 1985 [JP] Japan .................. 60-235124

[51] Int. Cl.⁴ .................. H02J 3/00; H02B 1/04
[52] U.S. Cl. .................. 361/391; 361/334; 361/383; 307/150; 363/141
[58] Field of Search .............. 307/149, 150; 363/141; 361/331, 334, 340, 391, 392, 393, 394, 390, 415, 426, 428, 429, 383, 386, 388

[56] References Cited

U.S. PATENT DOCUMENTS

| 4,249,227 | 2/1981 | Kato .................. 361/334 |
| 4,287,764 | 9/1981 | Staab .................. 361/391 |
| 4,288,838 | 9/1981 | Van Der Vegte .................. 361/429 |
| 4,498,123 | 2/1985 | Fuss .................. 361/391 |
| 4,621,200 | 11/1986 | Lovrenich .................. 307/150 |
| 4,625,259 | 11/1986 | Krechmer .................. 361/334 |

Primary Examiner—G. P. Tolin
Attorney, Agent, or Firm—Antonelli, Terry & Wands

[57] ABSTRACT

A power supply construction comprises a logic circuit section housed in a frame, a power supply section mounted rotatably on the frame in opposed to the logic circuit section for supplying power to the logic circuit section. Relay bars with an end arranged in the vicinity of the rotating axis of the power supply section are provided for supplying power to the logic circuit section. Power supply bars with an end arranged in the vicinity of the rotating axis are for outputting the voltages from the power supply section. In addition, a flexible conductor is provided for electrically connecting the relay bar and the power supply bar in such a manner that the power supply section is rotatable.

11 Claims, 9 Drawing Figures

POWER SUPPLY STRUCTURE AND SYSTEM FOR MOUNTING THE SAME

BACKGROUND OF THE INVENTION

1. Field of the Invention

The present invention relates to a power supply construction, or more in particular to a power supply construction suitable for supplying a large capacity of power to a large computer.

2. Description of the Prior Art

The main components of an electronic computer include a logic circuit section and a power supply section. In view of the fact that the power supply section of a large computer requires a great power capacity, conventional power supplies are fixed as a package in a separate housing or packaged in an area not adversely affecting the maintenance of the logic circuit section.

In spite of the progress of integration of the logic circuit section, the integration of the power supply units has not advanced comparatively. In conventional methods of packaging the power supply section, the power supply section is fixed with a maintenance area secured therearound on a rack-like mounting plate. With the increase in power supply capacity, however, the packaging space is undesirably increased, thereby reducing the efficiency of the power line distribution work.

An object of the present invention is to provide a power supply construction by which the packaging efficiency in a housing is improved thereby to reduce the floor space of installation.

Another object of the present invention is to provide a light-weight power supply construction on which the assembly and maintenance work are easy.

SUMMARY OF THE INVENTION

According to the present invention, there is provided a power supply construction comprising a logic circuit section housed in a frame, a power supply section disposed in opposed relationship with the logic circuit section and mounted rotatably on the frame for supplying power to the logic circuit section, a relay bar for supplying power to the logic circuit section and having an end thereof in the vicinity of a rotating axis of the power section, a power supply bar for output of the power supply section and having an end thereof in the vicinity of the rotating axis, and a flexible conductor for electrically coupling the end of the relay bar and the end of the power supply bar in such a manner as to render the power supply section rotatable.

DESCRIPTION OF THE PREFERRED EMBODIMENTS

Figure 1:
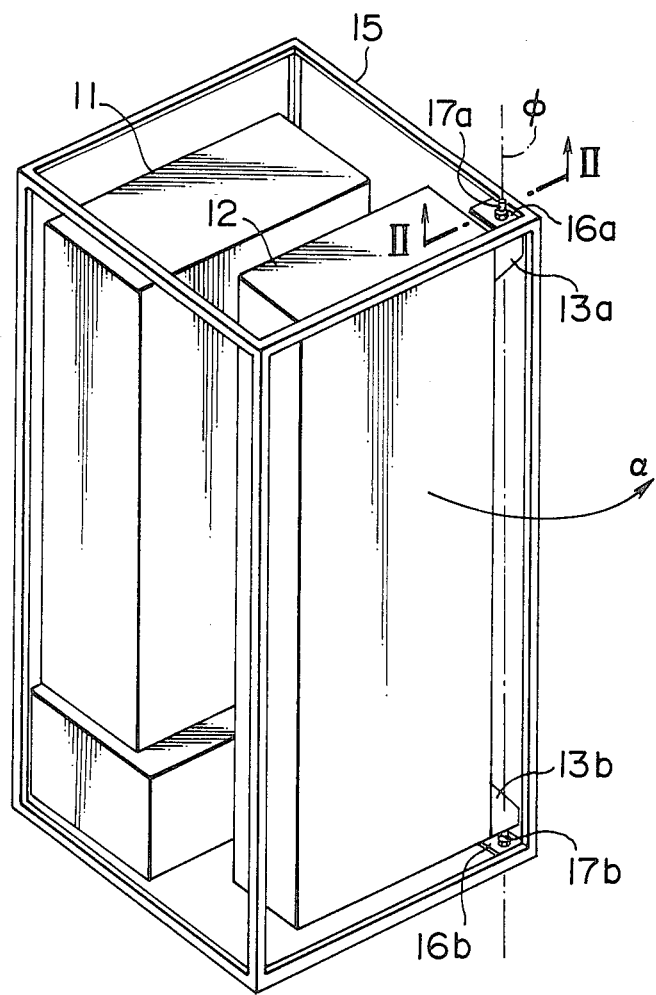
FIG. 1 is a schematic diagram showing an electronic computer according to the present invention.

A schematic diagram of an electronic computer to which a power supply construction according to the present invention is applied is shown in FIG. 1.

The electronic computer comprises a logic circuit section 11 for processing operations and a power supply section 12 (shown schematically) which are accommodated in a frame 15. The logic circuit section 11 is mounted securely on the frame 15, while the power supply section 12 is mounted rotatably in the direction of the arrow $\alpha$ around a rotating axis $\phi$.

Figure 2:
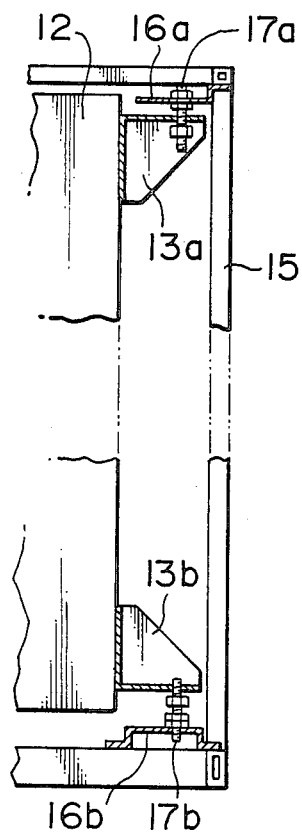
FIG. 2 is a diagram showing a manner in which a power section 12 and a frame 15 are mounted.

The embodiment under consideration includes hinges at the upper and lower ends of the power supply section 12 for rendering the power supply section 12 rotatable. The hinges include mounting plates 13a, 13b on the power supply 12 side, mounting plates 16a, 16b on the frame 15 side, and pins 17a, 17b. For facilitating the understanding of the configuration of the hinges, a sectional view along the line II—II in FIG. 1 is shown in FIG. 2.

The mounting plate 16a, having a hole adapted to fit the pin 17a on the frame 15, is provided at the upper part of the power supply unit 12. The mounting plate 16b, on the other hand, having a hole adapted to fit the pin 17b on the frame 15, is disposed at the lower part of the power supply unit 12. The power supply section 12 is made rotatable with the pins 17a and 17b inserted into the holes in the mounting plates 13a and 13b respectively on the power supply 12 side.

Figure 3:
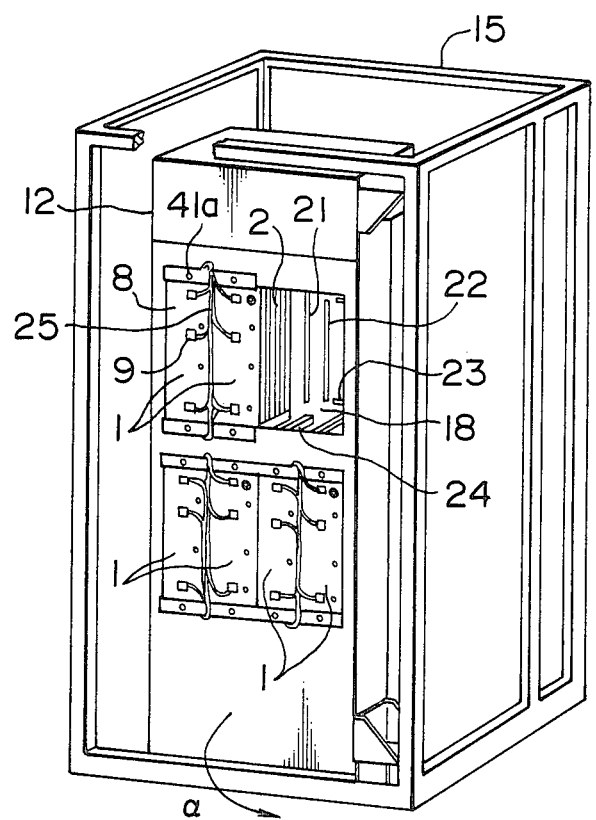
FIG. 3 is a diagram showing the power supply section 12 on which a power supply unit 1 is mounted.

(1) Power supply section 12;

The power supply section 12 is comprised of a plurality of power supply units. FIG. 3 shows the manner in which a multiplicity of power supply units 1 are mounted on the power supply section 12. In order to facilitate understanding of the manner in which the power supply units 1 are mounted, two units at the upper left part are not shown.

Before explanation of the power supply section 12, the configuration of the power units 1 will be described.

Figure 4:
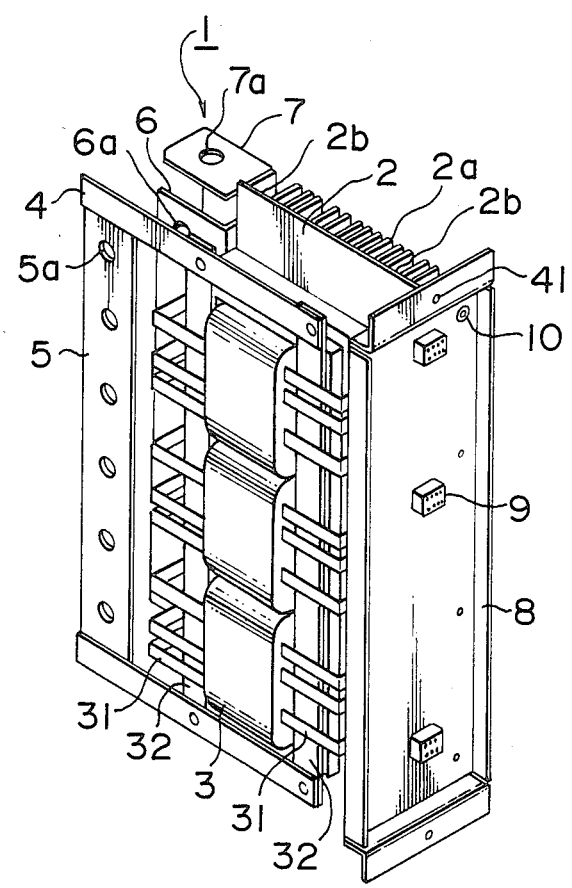
FIG. 4 is a schematic diagram showing the power supply unit 1.

(1)-(a) Power supply unit;

A schematic diagram of the power supply unit 1 according to the present embodiment is shown in FIG. 4.

Reference numeral 2 designates a radiation fin including a projection 2a for increasing the radiation area and fitting guide 2b projected upward and downward of the fin for facilitating the work of mounting the power supply unit 1 on the power supply section 12 (FIG. 3). Numeral 3 designates transformers which number three according to this embodiment, numeral 31 designates a secondary end of the transformer 3, and numeral 32 designates a common bar which is connected commonly to another secondary end 33 (FIG. 6) of the three transformers and is connected electrically through a bar 4 to an external electrode 5 made of a steel bar. The external electrode 5 has a multiplicity of terminal holes 5a. Numerals 6 and 7 designate external electrodes made of a steel bar having an electrical polarity opposite to the external electrodes 5. The external electrodes 6 and 7 have terminal holes 6a and 7a respectively.

Numeral 8 designates a fixed plate secured to the fin 2 with a screw 10. Numeral 9 designates connectors for primary AC power input provided on the fixed plate 8, which connectors 9 correspond to the respective transformers 3. Numeral 41 designates a hole into which a screw is inserted for securing the power supply unit 1 when the latter is mounted on the power supply section 12.

Figure 5:
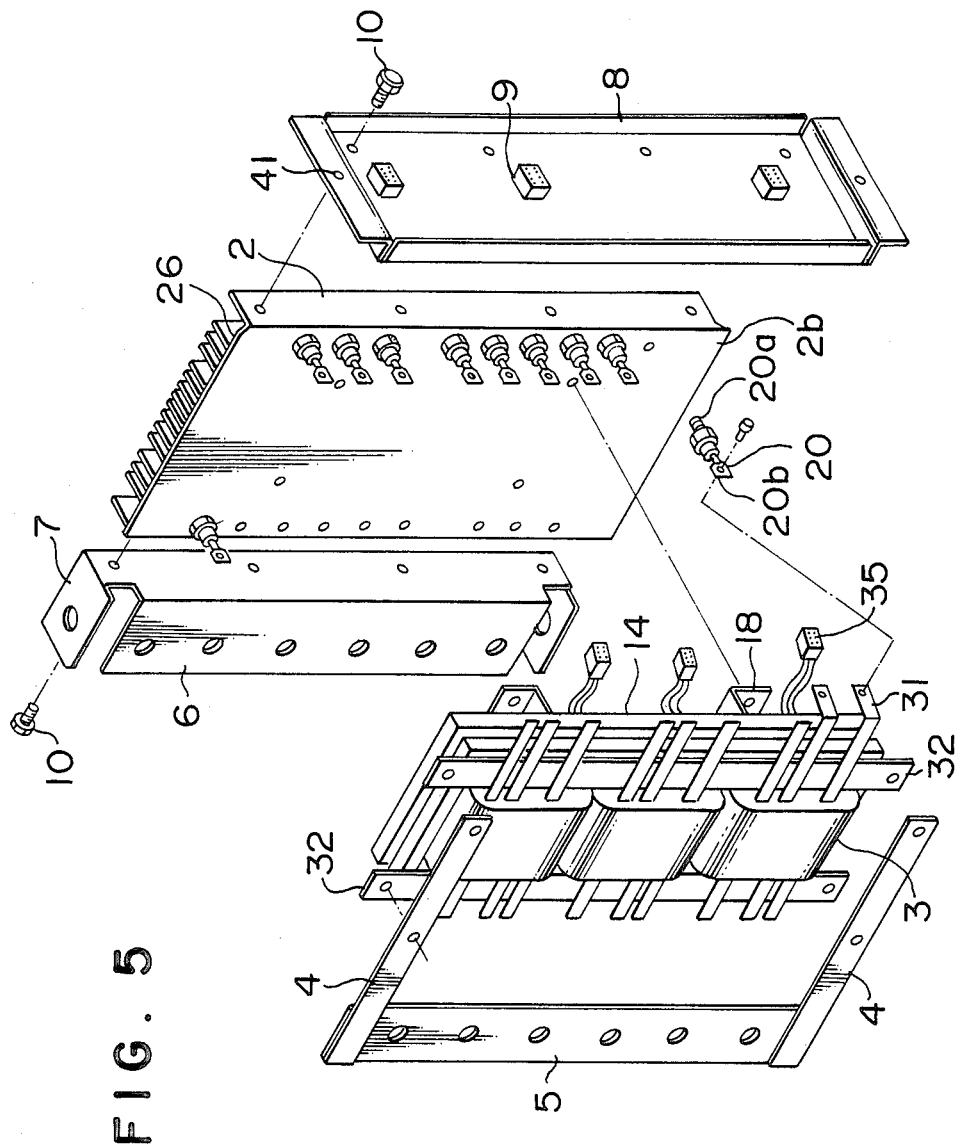
FIG. 5 is a diagram showing a configuration of the parts of the power supply unit 1.

This power supply unit will be understood more specifically with reference to the configuration of the parts shown in FIG. 5.

In FIG. 5, the same component parts are designated by the same reference numerals as in FIG. 4.

Numeral 20 designates a rectifier with are terminal 20a thereof being electrically connected, by being forced into the fin 2, and the other terminal 20b thereof being electrically connected, by being forced into the output terminal 31 of the transformer 3. As a result, the output voltage from the output terminal 31 is rectified by the rectifier 20 and produced to the external electrodes 6 and 7 through the fin 2.

Numeral 14 designates a fixing rest for holding the three transformers 3. A fitting 18 is for securing the fixing rest 14 to the fin 2. Numeral 35 designates a primary power terminal of each transformer, which is connected to the back of the connector 9.

Figure 6:
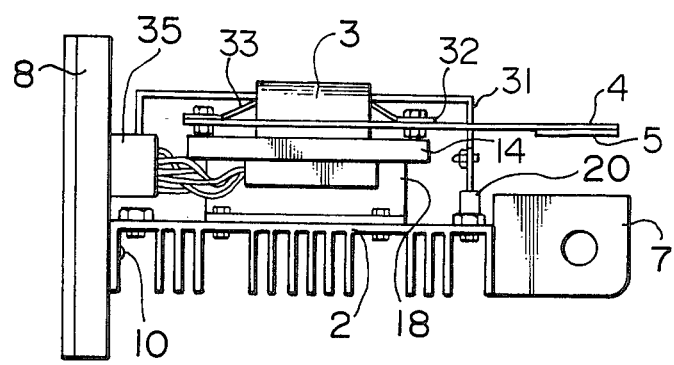
FIG. 6 is a plan view of the power supply unit 1.

A plan view of the power supply unit is shown in FIG. 6, in which the same component parts as those in FIG. 4 are designated by the same reference numerals as the corresponding parts in FIG. 4.

A secondary terminal 32 is connected with a secondary output bar and from the transformer 3.

As explained above, in the power supply unit according to this embodiment, a rectified voltage is applied to the external electrodes 5 and 6 or 7.

(1)-(b) Mounting the power supply unit on the power supply section;

Referring again to FIG. 3, the power supply section 12 has a multiplicity of power supply units 1 inserted therein which are secured by screws 41a through holes 41 of the fixing plate 8. Numeral 25 designates a wire for supplying the primary power to the power supply unit 1, which wire is connected to the connector 9. Numeral 18 designates a back plate of the power supply section 12 with longitudinal slots 21, 22 and lateral slot 23 formed therein. The longitudinal slot 21 is for fitting the external electrode 5 of the power supply unit 1, the longitudinal slot 22 for fitting the external electrode 6, and the lateral slot 23 for holding the external electrode 7. A multiplicity of these slots are formed in a number corresponding to the power units.

Numeral 24 designates a rail with a projection to enable the fitting guide to slide when the power supply unit is mounted, which rail is provided at both upper and lower parts for each power supply unit.

The power supply unit 1 is adapted to be inserted into the power supply section 12 with the fitting guide slided on the rail 24, and is screwed through the hole 41 of the fixing plate 8. The power supply unit 1, when inserted into the power supply section 12, has the external electrodes 5, 6, 7 fitted into the holes 21, 22, 23 respectively and projected through the back side of the power supply section 12.

Figure 7:
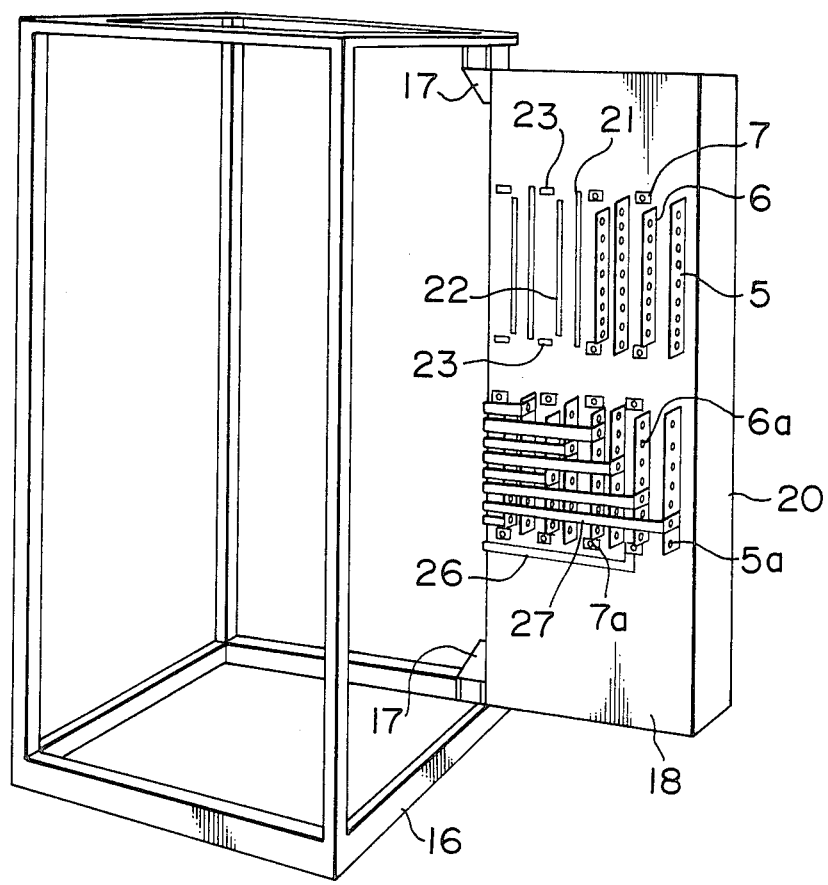
FIG. 7 is a diagram showing the manner in which the power supply section 12 is rotated.

(1)-(c) Connection of power supply section 12;

FIG. 7 shows the power supply section 12 turned open. The logic circuit section 11 is not shown for simplifying the diagram.

Two power supply units are inserted at the upper left part of the power supply section 12, and no power supply unit is fitted at the upper right part. Therefore, the external electrode of the power supply unit 1 is not projected from the corresponding holes 22, 23, 24 of the back plate 18. This corresponds to the insertion of the power supply units in FIG. 3. On the other hand, all of the four power supply units are inserted and wires connected in the lower part of the power supply section 12. The wires are connected by screwing the bent part at an end of the copper bars 26, 27 to the terminal holes 5a, 6a, 7a formed in the external electrodes 5, 6, 7 respectively.

The electrodes 5, 6 have a multiplicity of terminal holes, and by appropriately selecting them, the connection is effected freely without any electrical shorting. The other ends of the copper bars 26, 27 are arranged in alignment on the right side of the power supply section 12.

Figure 8:
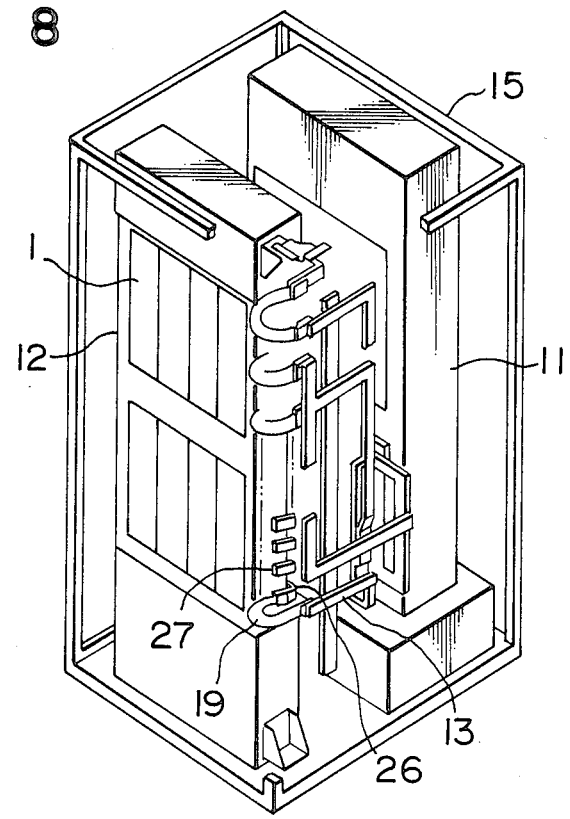
FIG. 8 shows the manner in which the power supply section 12 is connected with a relay copper bar on the frame 15 side.

(2) Connection of power supply section and logic circuit section;

The side of the power supply section 12 mounted on the frame 15 is shown in FIG. 8.

The other ends of the copper bars 26, 27 are visible on the side of the power supply section 12. It has been explained that the power supply section 12 is adapted to turn against the logic circuit section 11 by hinges mounted on the side thereof. The other ends of the copper bars 26, 27 are fixedly screwed by a flexible copper bar 19. The other copper bars of the power supply section 12 are also connected with a similar flexible copper bar.

A multiplicity of terminals of the relay copper bar 13 provided for different types of voltages supplied to the logic circuit section 11 are arranged along the rotating axis of the power supply section 12. The terminals of the relay bar 13 are connected to the flexible copper bars from the power supply section 12 respectively.

In this way, the copper bar terminals on the power supply section 12 side and the relay copper bar terminals are arranged along the rotating axis and connected with each other by flexible copper bars, so that the wires on both sides are prevented from being complexly intertwined when the power supply section 12 rotates against the logic circuit section 11.

Figure 9:
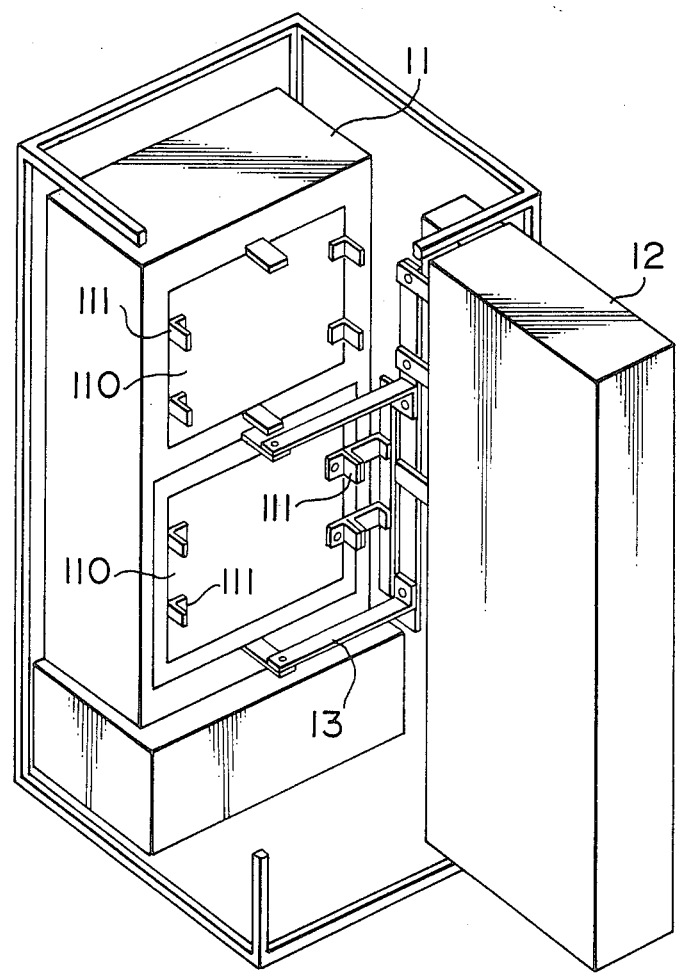
FIG. 9 is a diagram showing the manner in which a logic circuit section 11 is connected with the relay copper bar 13.

FIG. 9 shows the manner in which the logic circuit section 11 is connected with the relay copper bars 13. The power supply section 12 is shown in simplified form.

A multiplicity of base boards carrying a multiplicity of logic devices arranged thereon are connected on the interior of a mother board 110. A terminal 111 is supplied with a voltage required for supplying power to the base boards. The relay copper bar 13 is screwed to the terminal 111.

As shown in FIG. 7 or FIG. 12, it is seen that the power supply section 12 is capable of being pulled out smoothly, thereby facilitating the maintenance thereof.

In the case where one of the power supply units 1 runs out of order, the faulty power supply unit 1 may be demounted and replaced simply by removing the copper bars 26, 27 and the screw 41a (FIG. 3).

It will thus be understood from the foregoing description that according to the present invention a plurality of compact power supply units are used to supply power to a computer, and therefore the work of both assembly and maintenance are facilitated.

Further, in view of the similarity of the construction of the power supply units, mere insertion of a plurality of power supply units makes it possible to supply power of the same capacity as a large power supply.

We claim:

1. A power supply construction comprising:
   a logic circuit section housed in a frame;
   a power supply section mounted rotatably on said frame so as to rotate about a rotating axis in opposed relation to said logic circuit section for supplying power to said logic circuit section;
   a plurality of relay bars having first ends thereof arranged along said rotating axis for supplying a plurality of required voltages to said logic circuit section;
   a plurality of power supply bars for providing said required voltages from said power supply section, said power supply bars having first ends thereof arranged along said rotating axis; and
   a plurality of flexible conductors electrically connecting said first ends of said relay bars to said first ends of said power supply bars, respectively, so as to conduct said required voltages from said power supply section to said logic circuit section.

2. A power supply construction according to claim 1, wherein said power supply section includes;
   a plurality of power supply units, each of said power supply units including;
   a radiation fin having a fitting guide on upper and lower sides thereof,
   a panel with a power input connector on a first side of said radiation fin,
   a first power output bar with a plurality of terminals electrically connected to a second side of said radiation fin,
   rectifier means having a first electrode thereof electrically connected to said radiation fin,
   a plurality of transformers each having a primary electrode electrically connected to said power input connector and a first secondary electrode connected to a second electrode of said rectifier means, said transformers being secured to said radiation fin, and
   a second power output bar parallel to said first power output bar and electrically connected to a second secondary electrode of each of said transformers;
   said power supply section further including a plurality of rails for cooperating with said fitting guides of said power supply units in a manner to arrange said first and second power output bars of said power supply units parallel to each other, said power supply bars crossing longitudinally at right angles to said first and second power output bars arranged in parallel, each of said power supply bars having at least one point thereof electrically connected to a plurality of terminals of said first and second power output bars.

3. A power supply construction according to claim 1, said power supply section further comprising:
   a plurality of pairs of rails spaced apart in parallel relationship; and
   a plurality of power supply units including;
   radiation means having upper and lower edges extending longitudinally for sliding on said pairs of rails,
   a panel with a power input connector on a first side edge of said radiation means,
   a first power output bar with a plurality of terminals electrically connected to a second side edge of said radiation means,
   rectifier means having a first electrode thereof electrically connected to said radiation means,
   a plurality of transformers each having a primary electrode electrically connected to said power input connector and a first secondary electrode electronically connected to a second electrode of said rectifier means, said transformers being secured to said radiation means, and
   a second power output bar parallel to said first power output bar and electrically connected to a second secondary electrode of each of said plurality of transformers.

4. A power supply unit mounted between a pair of spaced apart, parallel rails, comprising:
   a radiation means having upper and lower edges extending longitudinally for sliding on said rails;
   a panel with a power input connector on a first side edge of said radiation fin;
   a first power output bar with a plurality of terminals electrically connected to a second side edge of said radiation means;
   rectifier means having a first electrode thereof electrically connected to said radiation means;
   a plurality of transformers each having a primary electrode electrically connected to said power input connector and a first secondary electrode electrically connected to a second electrode of said rectifier means, said transformers being secured to said radiation means; and
   a second power output bar parallel to said first power output bar and electrically connected to a second secondary electrode of each of said plurality of transformers.

5. A power supply unit according to claim 4, wherein said radiation means is substantially rectangular shaped and includes a plurality of projections extending between said upper and lower edges thereof.

6. A power supply construction comprising:
   a logic circuit section housed in a substantially rectangular shaped support frame;
   a substantially rectangular shaped power supply section for supplying power to said logic circuit section, a first edge of said power supply section being rotatably connected to one edge of said support frame such that said power supply section is positioned in opposed relation to said logic circuit section when in a closed position;
   a plurality of relay bars having a first end thereof arranged along said one edge of said frame for supplying a plurality of required voltages to said logic circuit section;
   a plurality of power supply bars for providing said required voltages from said power supply section, said power supply bars having first ends thereof arranged along said first edge of said power supply section; and
   a plurality of flexible conductors electrically connecting respective ones of said first ends of said relay bars to respective ones of said first ends of said power supply bars.

7. A power supply section comprising:
   a plurality of power supply units including;
   radiation means having upper and lower edges extending longitudinally, a panel with a power input connector on a first side edge of said radiation means, a first power output bar with a plurality of terminals electrically connected to a second side edge of said radiation means, rectifier means having a first electrode thereof electrically connected to said radiation means, a plurality of transformers each having a primary electrode electrically connected to said power input connector and a first secondary electrode electrically connected to a second electrode of said rectifier means, said transformers being secured to said radiation means, and a second power output bar parallel to said first power output bar and electrically connected to a second secondary electrode of each of said plurality of transformers, said power supply section further comprising a plurality of spaced apart, parallel rails for supporting said upper and lower edges of said radiation means so as to arrange said first and second power output bars of said power units parallel to each other, said power supply bars crossing longitudinally at right angles to said first and second power supply bars arranged in parallel, each of said power supply bars having at least one point thereof electrically connected to at least one terminal of said first and second power output bars.

8. A power supply construction comprising:

a logic circuit section housed in a frame;

a power supply section mounted rotatably on said frame for rotating about a rotating axis in opposed relation to said logic circuit section for supplying power to said logic circuit section;

a plurality of relay bars having a first end thereof arranged along said rotating axis for supplying a plurality of required voltages to said logic circuit section, said first end of one of said relay bars having a bar portion disposed along said rotating axis such that a longitudinal direction of said bar portion coincides with a longitudinal direction of said rotating axis;

a plurality of said power supply bars for providing said required voltages from said power supply section, said power supply bars having first ends thereof arranged along said rotating axis, a plurality of said first ends of certain power supply bars which provide the same required voltage being joined to each other, said bar portion of said one of said relay bars being sufficiently long to oppose said plurality of said first ends of certain power supply bars;

a plurality of flexible conductors electrically connecting said first ends of said relay bars to said first ends of said power supply bars, one of said plurality of flexible conductors also being connected to said bar portion of said one of said relay bars such that electric current flows from said certain power supply bars into said one of said relay bars.

9. A power supply section comprising:

a plurality of power supply units, each including;

a radiation means having fitting guides extending on opposite sides of said power supply unit, a panel with a power input connector on a first side of said radiation means, a first power output bar with a plurality of terminals electrically connected to a second side of said radiation means, rectifier means having a first electrode thereof electrically connected to said radiation means, a plurality of transformers each having a primary electrode electrically connected to said power input connector and a first secondary electrode electrically connected to a second electrode of said rectifier means, said transformers being secured to said radiation means, and a second power output bar parallel to said first power output bar and electrically connected to a second secondary electrode of each of said plurality of transformers, said power supply section further comprising a plurality of spaced apart, parallel rails supporting said guides extending on opposite sides of said power supply unit so as to arrange said first and second power output bars of said power supply unit parallel to each other, said power supply bars crossing longitudinally at right angles to said first and second power output bars having at least one point thereof electrically connected to one of a plurality of terminals of said first and second power output bars.

10. A power supply section according to claim 9, wherein said terminals of said first and second power output bars include hole means, said first and second output bars and relay bars being connected to said flexible conductors by screw means through said hole means.

11. A power supply section according to claim 9, wherein said fitting guides of said radiation means comprise upper and lower edges extending longitudinally.

* * * * *